US010144306B2

(12) United States Patent
Dudar (10) Patent No.: US 10,144,306 B2
(45) Date of Patent: Dec. 4, 2018

(54) BATTERY HEALTH EVALUATION (71) Applicant: Ford Global Technologies, LLC, Dearborn, MI (US)

(72) Inventor: Aed M. Dudar, Canton, MI (US)

(73) Assignee: FORD GLOBAL TECHNOLOGIES, LLC, Dearborn, MI (US)

(*) Notice: Subject to any disclaimer, the term of this patent is extended or adjusted under 35 U.S.C. 154(b) by 200 days.

(21) Appl. No.: 15/408,453

(22) Filed: Jan. 18, 2017

(65) Prior Publication Data

US 2018/0201151 A1   Jul. 19, 2018

(51) Int. Cl.
    *B60L 1/00* (2006.01)
    *B60L 11/18* (2006.01)
    *G01R 31/36* (2006.01)

(52) U.S. Cl.
    CPC ............ *B60L 11/1872* (2013.01); *B60L 1/00* (2013.01); *B60L 11/1822* (2013.01); *B60L 11/1861* (2013.01); *G01R 31/3606* (2013.01); *G01R 31/3679* (2013.01)

(58) Field of Classification Search
    CPC ........................................................ B60L 1/00
    USPC ............................. 307/9.1, 10.1, 10.6, 10.7
    See application file for complete search history.

(56) References Cited

U.S. PATENT DOCUMENTS

| 4,028,616 | A  | 6/1977  | Stevens |
| 4,665,370 | A  | 5/1987  | Holland |
| 5,281,919 | A  | 1/1994  | Palanisamy |
| 5,900,734 | A  | 5/1999  | Munson |
| 6,097,193 | A  | 8/2000  | Bramwell |
| 6,469,512 | B2 | 10/2002 | Singh et al. |
| 6,633,165 | B2 | 10/2003 | Bertness |
| 8,849,497 | B2 | 9/2014  | Zhang et al. |
| 2011/0082621 | A1 | 4/2011 | Berkobin et al. |
| 2011/0221392 | A1 | 9/2011 | Gale et al. |
| 2014/0379174 | A1 | 12/2014 | Holub et al. |

OTHER PUBLICATIONS

Search Report for United Kingdom Intellectual Property Office dated Jul. 17, 2018 regarding Application No. GB1800771.6 (3 pages).

*Primary Examiner* — Adi Amrany
(74) *Attorney, Agent, or Firm* — Frank A. MacKenzie; Bejin Bieneman PLC (57) ABSTRACT

A vehicle includes a battery health evaluation system. A vehicle battery is electrically loaded upon determining that an ambient temperature equals or exceeds a first temperature. A voltage of the battery is measured during loading. A magnitude of the voltage plateau is determined. The battery is identified as inadequate upon determining that the magnitude of the plateau is less than the target voltage.

20 Claims, 5 Drawing Sheets

BATTERY HEALTH EVALUATION

BACKGROUND

Motor vehicles, including autonomous motor vehicles, can have internal combustion engines started with electric motor drawing power from an electric battery. When the battery nears the end of its useful life, it may not retain enough energy to start the engine. Sometimes even a human operator may not recognize the symptoms of a weak battery. An autonomous vehicle may be unable to make such a diagnosis and or may lack a sufficient human interface for a human to do so.

DETAILED DESCRIPTION

Introduction

A vehicle includes a battery health evaluation system. A vehicle battery is electrically loaded upon determining that an ambient temperature equals or exceeds a first temperature. A voltage of the battery is measured during loading. A magnitude of the voltage plateau is determined. The battery is identified as inadequate upon determining that the magnitude of the plateau is less than the target voltage.

Relative orientations and directions (by way of example, upper, lower, bottom, forward, rearward, front, rear, back, outboard, inboard, inward, outward, lateral, left, right) are set forth in this description not as limitations, but for the convenience of the reader in picturing at least one embodiment of the structures described. Such example orientations are from the perspective of an occupant seated in a driver seat, facing a dashboard. In the Figures, like numerals indicate like parts throughout the several views.

Exemplary System Elements

Figure 1:
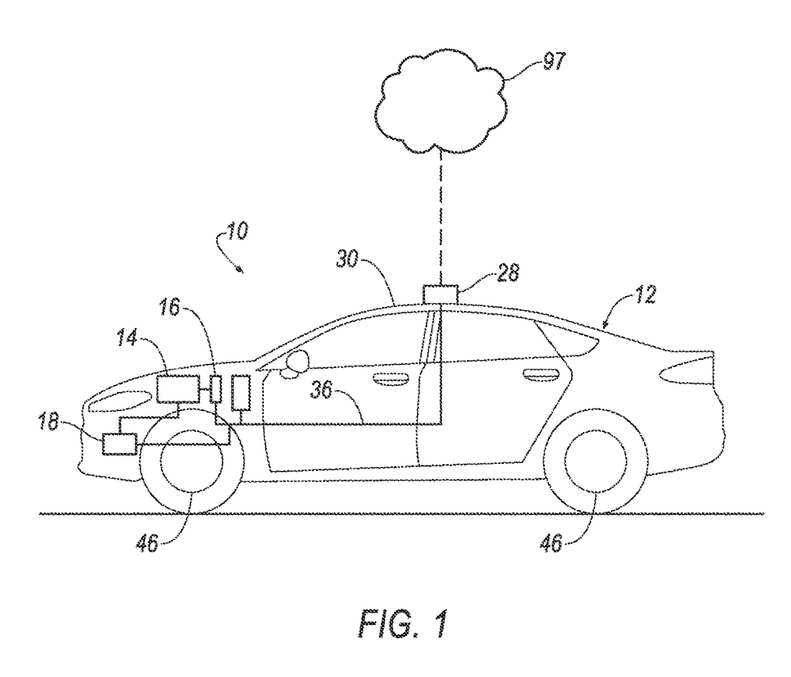
FIG. 1 is schematic illustration of an example vehicle having an example battery health evaluation system.
Figure 2:
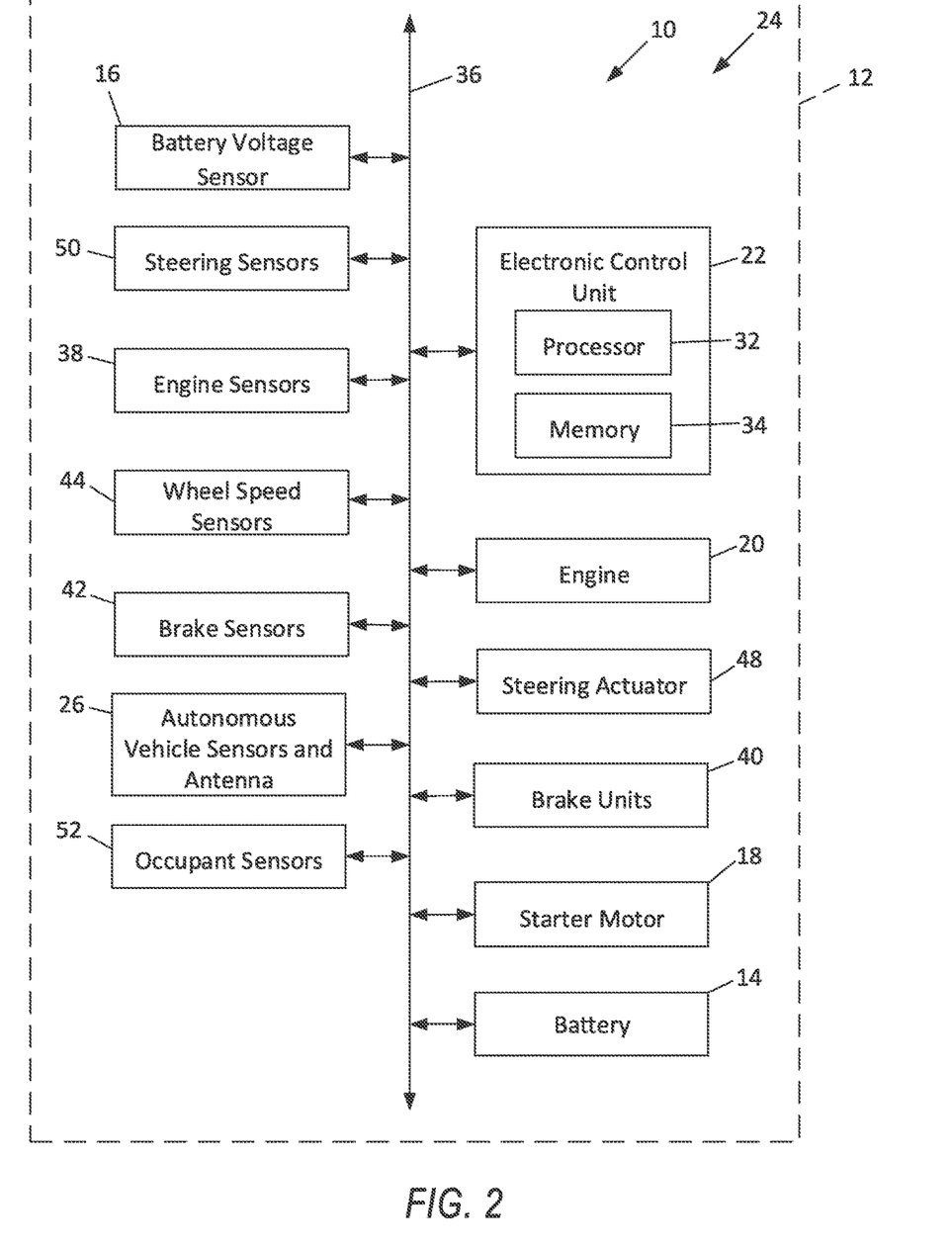
FIG. 2 is a block diagram illustration of an example vehicle battery health evaluation system.
Figure 3A:
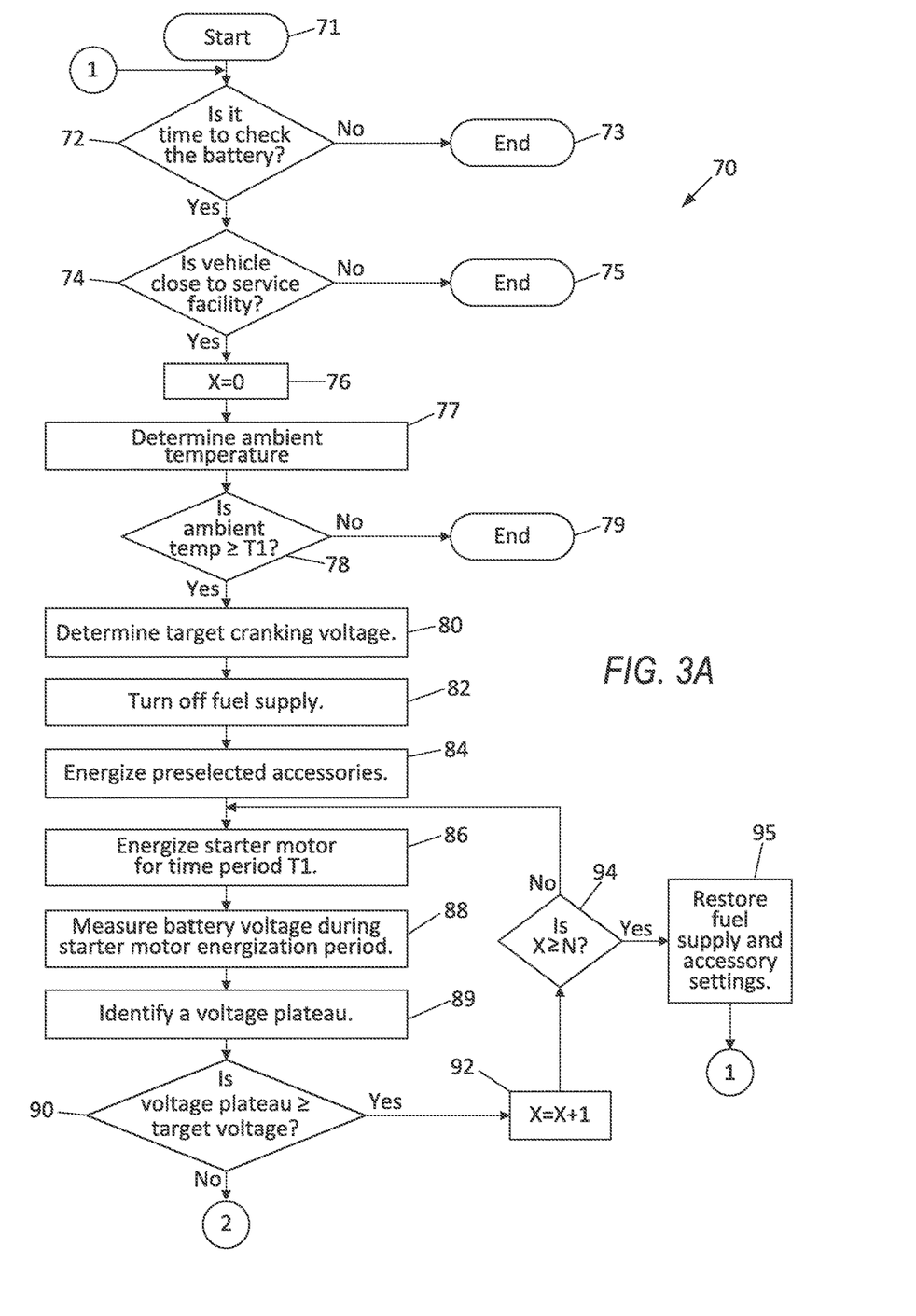
FIGS. 3A and 3B are collectively an example flowchart of a process executed by the battery health evaluation system.
Figure 3B:
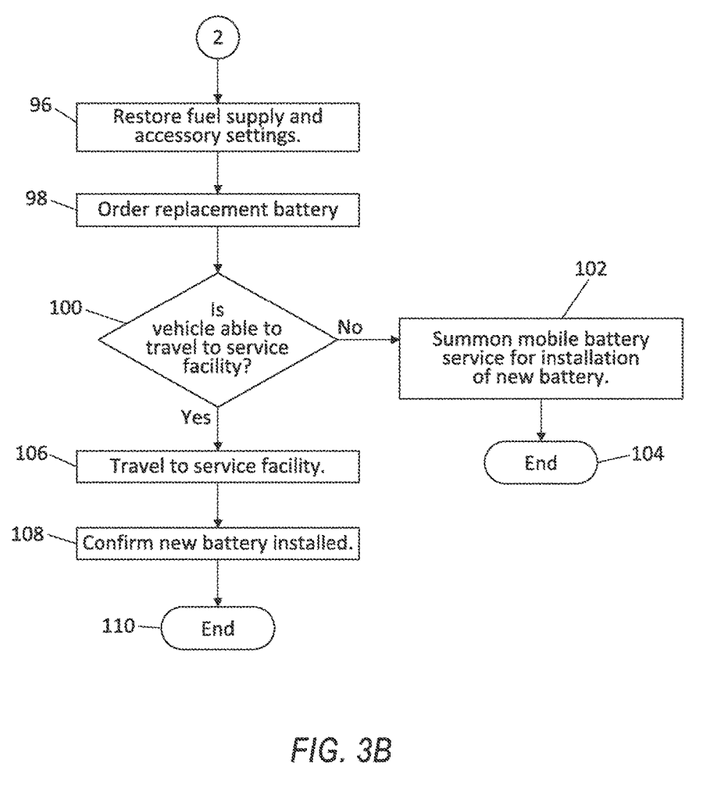

With reference to FIGS. 1 through 3, an example battery health evaluation system 10 for an example vehicle 12 includes an example battery 14 and an example battery voltage sensor 16 able to detect a voltage of battery 14. The term "battery health," as used in this description, means an ability of a battery to store electrical energy sufficient to start an internal combustion engine 20 of the vehicle 12 in cold ambient temperatures, e.g. zero degrees Fahrenheit. The system and method allow battery health to be evaluated at warm ambient temperatures, e.g. 70 degrees Fahrenheit, anticipating possible engine starting concerns that may occur at cold ambient temperatures.

The battery 14 provides electrical power to electrical components of vehicle 12 which may include an electric starter motor, i.e., a starter 18, for spinning a crankshaft (not shown) of the internal combustion engine 20 to a target speed as part of an engine-starting process. The ability of the starter 18 to get the crankshaft to reach the target speed is in part a function of a magnitude of electrical energy available to the starter 18 from the battery 14. The battery 14 may be recharged after and during its use to restore its stored electrical energy. The battery may be recharged by an alternator or a generator in a well-known manner. Motor 18 may be a motor-generator, functioning as a generator as well as a motor in a well-known manner.

The electrical energy available from the battery 14 may be determined by measuring a voltage across a positive terminal and a negative terminal of the battery 14 with the battery voltage sensor 16. During such measurement, the battery 14 is electrically loaded by energizing the starter 18 to crank the engine 20, i.e., spin the crankshaft.

Batteries have a limited life. Discharging the battery and recharging the battery 14 gradually reduces the health of the battery 14, i.e., an ability of the battery to store energy. Batteries 14 can only sustain a limited number of charge and discharge cycles before the ability to store electrical energy begins to diminish. A useful life of a battery 14 used to start the internal combustion engine 20 substantially ends with a loss of the battery's ability to store and provide sufficient electrical energy to start the vehicle's engine 20.

The available electrical energy of the battery 14 is affected by a temperature of the battery 14, decreasing with the temperature. The energy required to spin the crankshaft to start the engine 20 is also affected by a temperature of the engine, increasing with a decrease in the temperature. Batteries 14 are expected to provide enough power to start an engine at temperatures of zero degrees Fahrenheit. A battery is rated based on the electrical current the battery can provide under load at zero degrees Fahrenheit for a predetermined period of time, e.g. 30 seconds. The current thus measured is called cold cranking amps, commonly abbreviated as CCA.

A human vehicle operator may be able to discern that the battery 14 is in a weakened condition. Clues suggesting a weakened battery include longer starting times, slower cranking, dimming of headlights at engine idle, and/or erratic performance of electrical accessories such as power windows. Prompt attention to such occurrences, and the procurement and installation of a new battery, will allow the vehicle 12 to continue operation without leaving the vehicle and its operator and passengers stranded. Failure to notice such signals may result in the vehicle 12 being disabled by an inability to start. The described battery health evaluation system anticipates a weakening battery by testing the battery 14 under warm ambient conditions, e.g. 70 degrees Fahrenheit, to avoid a failure of the battery 14 in cold ambient conditions, e.g. zero degrees Fahrenheit.

System 10 also includes a computing device, e.g., an electronic control unit ("ECU") 22. Vehicle 12 may be an autonomous vehicle (as that term is defined below), having a pilot system 24. The pilot system 24 may include a plurality of sensors and a plurality of actuators, connected to the ECU 22.

The sensors of the pilot system 24 may include a plurality of vehicle situational awareness sensors or autonomous vehicle sensors ("AV sensors") 26. AV sensors 26 may include sensors mounted inside a vehicle passenger cabin, and may additionally be mounted outside of the vehicle in a protective shell 28 on a roof 30 of the vehicle or in a fascia of the vehicle. A preferred location may depend on the type of sensor. An identification of several exemplary types of sensors that may be used is provided below. In vehicles 12 allowing autonomous vehicle operation, the pilot system 24 may include the battery health evaluation system 10 to allow the health system 10 to direct the operation of the vehicle 12.

ECU 22 may be comprised of a single computing device, as shown in FIG. 2, or may alternatively be comprised of a plurality of computers (e.g., ECUs), including, for example, a powertrain computer, itself potentially comprising an engine computer and a transmission computer, an infotainment computer, a chassis systems computer, restraint system computer, a vehicle security computer, and so on. ECU 22 includes an electronic processor 32 and an associated memory 34. System 24 may further include a vehicle network 36 including one or more wired and/or wireless communications media such as an example system Control Area Network ("CAN") bus or a Local Interconnect Network ("LIN") and/or other communications interface. Network 36 provides a transmission media between and connecting elements of the battery health evaluation system 10 and the pilot system 24 including ECU 22 and components and ancillary systems including, by way of example, engine 20, engine sensors 38, a plurality of brake units 40, brake sensors 42, wheel speed sensors 44 associated with wheels 46, a steering actuator 48, steering sensors 50, occupant sensors 52, turning signals (not shown), and/or vehicle situational awareness sensors 26.

Vehicle 12 includes four wheels 46, each of which may include a tire. Each of wheels 46 may be associated with one of the brake units 40. Wheel speed sensors 44 may be integrated into brake units 40. Steering actuator 48 and associated steering sensors are incorporated into the vehicle 12 steering system. Engine 20 may, by way of example, be an internal combustion engine providing all propulsive power or may be in combination with an electric motor, i.e., a so-called hybrid powertrain. Engine 20 may or may not include or be coupled to a transmission providing torque and speed ratios. Engine 20 may be a single unit near a front of vehicle 12, or engine 20 may alternatively be located elsewhere in the vehicle 12.

Each of engine 20, brake units 40, starter motor 18, battery 14 and steering actuator 48 are illustrated as connected directly to ECU 22 through network 36, but may alternatively or additionally be connected directly to ECU 22. Each of engine 20, brake units 40, and steering actuator 48 may include a respective electronic controller that receives instructions from ECU 22.

The memory 34 of ECU 22 includes one or more forms of computer-readable media, and stores instructions executable by the processor 32 for performing various operations, including such operations as disclosed herein. Processor 32 may read and execute such instructions. ECU 22 includes programming to autonomously operate autonomous vehicle 12 in a fully autonomous mode.

For purposes of this disclosure, the term "autonomous vehicle" is used to refer to a vehicle operating in the fully autonomous mode. The fully autonomous mode is defined as one in which each of vehicle 12 propulsion (typically via a powertrain including engine 20 as defined herein), braking, and steering are controlled by ECU 22 under substantially all circumstances. In a semi-autonomous mode, one or two of these are controlled by the ECU 22, and in a non-autonomous mode, none of them are.

The memory 34 of ECU 22 also stores data. Data may include collected data that is collected from a variety of devices. In general, collected data may include any data from a map database, and any data that may be gathered by any data collection device including engine sensors 38, wheel speed sensors 44, steering sensors 50, occupant sensors 52, AV sensors 26, battery voltage sensor 16, and/or data computed from such data. Exemplary steering sensors 50 may include a rack position sensor and/or a lateral acceleration sensor. Exemplary AV sensors 26 may include vehicle context and position sensors and location sensors such as a radar sensor, a LIDAR sensor, a vision sensor (e.g., a camera), a global positioning system ("GPS") sensor, antennae and the like. Radar sensors may be used both for locating other objects, and for, by exploiting the Doppler effect, determining a relative velocity of such other objects. The foregoing examples are not intended to be limiting. Other types of data collection devices may be used to provide data to ECU 22. Data may also include calculated data calculated in ECU 22 from collected data and from other calculated data.

Figure 4:
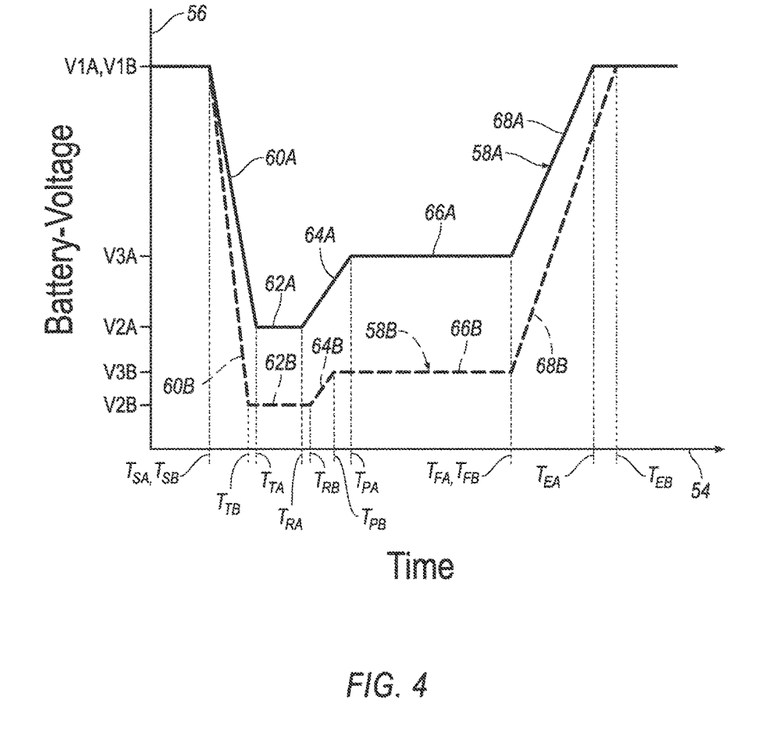
FIG. 4 is an example graph of voltage versus time during a battery load event.

The battery voltage sensor 16 provides a voltage signal proportional to the magnitude of voltage across the positive and negative terminals of the battery 14. An exemplary graph of the magnitude of voltage across the positive and negative terminals of the battery 14 is illustrated in FIG. 4. Time increases along a horizontal axis 54 in the direction of an arrowhead of axis 54. Voltage increases along a vertical axis 56 in a direction of an arrowhead of axis 56. A first plot 58A illustrated with a solid line is an example battery voltage plot 58A for the battery 14 in a new condition. A second plot 58B illustrated with a dashed line is an example battery voltage plot 58B for the battery 14 in a worn-out, i.e., inadequate, condition. The battery 14 is in the inadequate condition when it does not retain enough power to crank the engine crankshaft at a high enough speed of rotation to start the engine 20 at a predetermined cold temperature. Zero degrees Fahrenheit is an exemplary temperature.

Plot 58A, illustrating an example performance of a new battery 14 subjected to a health test cycle, starts at a first voltage V1A. Voltage V1A is a magnitude of voltage provided by the battery 14 when battery 14 is unloaded. An example value of V1A for a battery identified as a 12 Volt battery may be 12.5 Volts. At a start time $T_{SA}$ for the health test cycle, an electrical load is imposed on battery 14. The load may be equivalent to the cranking load. The magnitude of voltage available from the battery 14 drops during an initial response portion 60A of the plot 58A to voltage V2A at trough time $T_{TA}$. An example value of V2A may be 6 Volts. Plot 58A may include an initial trough or plateau portion 62A beginning at time $T_{TA}$. Trough or plateau portion 62A may extend to a time $T_{RA}$ where an initial recovery portion 64A starts as the voltage recovers from the sudden imposition of the cranking load. At a time $T_{PA}$, the voltage may stabilize under the cranking load at a cranking plateau 66A at a voltage V3A. An example value of V3A for a new battery at 70 degrees Fahrenheit may be 11.5 Volts. The cranking load may be terminated at a time $T_{FA}$, an end of the health test cycle. An elapsed time from the initiation of the imposition of the cranking load at $T_{SA}$ to the termination of the cranking load at $T_{FA}$ may be 30 seconds. With termination of the cranking load, battery 14 gradually recovers its voltage output as illustrated by a reduced-load recovery portion 68A. At an end of recovery portion 68A, which may take 10 or more seconds, the voltage output of battery 14 substantially returns to V1A.

Plot 58B, illustrating an example performance of a battery 14 in an inadequate condition subjected to a health test cycle, starts at a first voltage V1B. Voltage V1B is a magnitude of voltage provided by the battery 14 when battery 14 is unloaded. An example value of V1B for a battery identified as a 12 Volt battery may be 12.5 Volts. At a start time $T_{SB}$ for the health test cycle, an electrical load is imposed on battery 14. The load may be equivalent to the cranking load. The magnitude of voltage available from the battery 14 drops during an initial response portion 60B of the plot 58B to voltage V2B at trough time $T_{TB}$. An example value of V2B may be 3 Volts. Plot 58B may include an initial trough or plateau portion 62B beginning at time $T_{TB}$. Trough or plateau portion 62B may extend to a time $T_{RB}$ where an initial recovery portion 64B starts as the voltage recovers from the sudden imposition of the cranking load. At a time $T_{PB}$, the voltage may stabilize under the cranking load at a cranking plateau 66B at a voltage V3B. An example value of V3B for a worn-out, i.e., inadequate battery at 70 degrees Fahrenheit may be 9.5 Volts. The cranking load may be terminated at a time $T_{FB}$, an end of the health test cycle. An elapsed time from the initiation of the imposition of the cranking load at $T_{SB}$ to the termination of the cranking load at $T_{FB}$ may be 30 seconds. With termination of the cranking load, battery 14 gradually recovers its voltage output as illustrated by a reduced-load recovery portion 68B. At an end of recovery portion 68B, which may take 10 or more seconds, the voltage output of battery 14 substantially returns to V1B.

ECU 22 may be programmed to identify the magnitude of the cranking plateaus. A method or process 70 for vehicle 12 to identify and respond to a inadequate battery 14 is described below.

Processing

FIGS. 3A and 3B illustrates an example battery health evaluation process 70 that may be included in program instructions stored in ECU 22 of vehicle 12. ECU 22 executes the steps illustrated in FIGS. 3A and 3B as described below. A computer program for executing process 70 may be instantiated in start block 71, e.g., when a power-on command is issued, as may be associated with the vehicle being powered up responsive to an approach or a touch by a vehicle passenger.

Next, decision block 72 determines when it is time to check the battery 14. A time to check the battery may be established based on a predetermined frequency for such checks, such as once per month. The battery may be checked at such a frequency. It may also be desirable to perform the battery checks when the vehicle is without occupants to avoid having an occupant misinterpret an execution of a battery health check process as a vehicle malfunction. For example, the battery test may be carried out when the car has been stopped for more than one hour. The frequency of battery tests may be increased as the battery ages, particularly after the battery is more than a predetermined age, e.g. four years old.

When decision block 72 determines that it is not time to check the battery 14, then process 70 moves to end block 73 and the process 70 is terminated.

When it is determined that it is time to check the battery 14, process 70 may move to decision block 74. Decision block 74 determines whether the vehicle 12 is close (e.g. within 30 kilometers) to a service facility where the battery could be replaced, and from which a mobile battery service, including a service vehicle, could be dispatched. Such a determination may be made in anticipation of a possible need to replace the battery. As an additional precaution, the ECU may communicate with a cloud-based network 97 including, by way of example, a vehicle service network or a fleet operations network, advising of the vehicle's present location and the possibility of exhausting battery power. Alternatively, the ECU 22 may send a vehicle-to-everything (V2X) message to the closest service facility or to the network 97. A V2X message system is a local area network system and may be an aggregation of vehicle-to-vehicle (V2V), vehicle-to-pedestrian (V2P), vehicle-to-infrastructure (V2I) and vehicle-to-grid (V2G) network systems. The determination of proximity to a service location may be made using data from the GPS sensor and available map data. When the vehicle 12 is not close to a service facility, the process 70 moves to end block 75 and the process 70 is terminated.

When it is determined that the vehicle 12 is close to the service facility, process 70 may move to process block 76. Process block 76 resets a variable X used to control a number of repetitions of the battery health test cycle as described below. The variable X may be reset to a value of zero. Process 70 then moves to process block to determine an ambient temperature.

Process 70 then moves to decision block 78. Decision block 78 determines whether the ambient temperature is greater than or equal to a predetermined ambient temperature T1, e.g. 70 degrees Fahrenheit. When the ambient temperature does not meet or exceed the target temperature of T1, process moves to end block 79 and terminates.

When decision block 78 determines that the ambient temperature is greater than or equal to temperature T1, it moves to process block 80. Process block 80 calculates a target cranking voltage based on the value of measured ambient temperature. The target cranking voltage may be a minimally acceptable voltage for an adequate battery for the ambient temperature. A look-up table in memory 34 may be used to determine a cranking voltage at present ambient temperature that corresponds to a target cold cranking electrical current objective, i.e. target at a predetermined temperature, e.g., zero degrees Fahrenheit. An adequate battery may be defined as a battery providing a cranking voltage of greater than voltage V3B. Accordingly, an inadequate battery provides a cranking voltage equal to or less than V3B.

With the target value of V3B established, process 70 moves to process block 82 to disable the engine ignition. An exemplary way to disable engine ignition is to turn off the fuel supply. An alternative way to disable engine ignition of an Otto cycle engine is to disable operation of the engine's 20 spark plugs.

Process 70, after disabling the engine ignition, may also energize preselected accessories that are unrelated to starting the engine to increase a load on the battery 14. Example accessories may include vehicle lights, including headlights and taillights, and a cabin air circulation fan motor, an engine cooling fan motor and window defrosters. Such loading may be contemporaneous with starting the vehicle 12, and must also be sustained by battery 14 when starting the vehicle engine 20.

Following process block 84, or simultaneous with process block 84, starter motor 18 is energized by battery 14. For improved assurance of battery health relative to energizing the starter motor 18 just once, the starter motor may be energized a plurality of times. Three times is an exemplary number of repetitions. The energization of starter motor 18 begins at time $T_{SA}/T_{SB}$ as illustrated in FIG. 4. While the starter motor 18 is energized, the voltage across the battery terminal is measured, as per process block 88. Battery voltage sensor 16 may be used for the measurement of battery voltage. Such measurement may alternatively be initiated before or coincident with the energization of the starter motor 18. Measurements may be made at a frequency of four samples per second. The rate of sampling is not critical. While sampling may be done at a higher frequency, system operation does not require that. As energization is for a predetermined period of time, e.g., a range of time from 10 seconds to 30 seconds, sampling may also be done at a lower frequency rate as well.

Process block 89 follows process block 88. ECU 22 may use the voltage measurement data to identify a voltage plateau in accord with process block 89. Process 70 proceeds to decision block 90.

Decision block 90 determines whether the measured voltage is greater than the target voltage such as V3B. The logic of decision block 90 may compare the cranking plateau, e.g. 66A, 66B of the measured voltage, to the target voltage, e.g. V3B. When the cranking plateau of the measured voltage exceeds the target voltage, the process 70 moves to process block 92.

Process block 92 increases the value of the variable X by one. Process 70 moves to decision block 94 and checks whether the variable X has reached a predetermined value of N. The value N is the number of times that the battery 14 is to be subjected to the health test cycle, i.e., loaded and measured, to confirm battery health. The value N may equal three.

Process 70 moves to block 94 which determines whether the present value of X equals or exceed the selected value of N. When X is greater than or equal to N, process 95 moves to process block 95.

Process block 95 restores the fuel supply and the accessory settings so that the vehicle systems are as they were before the battery health test cycles were initiated. Following the restoration by process block 95, process 70 returns to decision block 72. Alternatively, instead of returning to decision block 72, process 70 may terminate and reinitiate during a subsequent operation of the vehicle 12. When X is not greater than or equal to N, that is, when X is less than N, process 70 return to block 86 to again energized starter motor 18 and measure the voltage across the battery terminals.

When decision block 90 determines that the measured voltage is not greater than the target voltage, the process 70 may restore the fuel supply and accessory settings as illustrated by process block 96.

Process 70 may next cause ECU to identify the battery 14 as inadequate and to order a replacement battery as per process block 98. The identification of the battery 14 as inadequate may be inferential based on the ordering of the replacement battery. Such an order may be made via communication with the cloud-based network 97 including, by way of example, the above-referenced vehicle service network or fleet operations network.

Having ordered the replacement battery, the process 70 moves to decision block 100. Decision block 100 determines whether the vehicle 12 is able to travel to a service facility, and, when a battery is ordered, the service facility being coincident with an expected destination of the replacement battery. When the vehicle 12 is not able to travel to the service facility, as when there is insufficient battery power to start the engine 20, process 70 moves to process block 102. Process block 102 summons a mobile battery service to bring and install the new battery in vehicle 12. Such a summons may be made with a message sent through the cloud-based network 97. Once the summons has been communicated, process 70 is terminated at end block 104.

When decision block 100 determines that the vehicle 12 is able to travel to the service facility, process block 106 directs vehicle 12 to travel to the service facility. Process block 108 then confirms that a new battery has been installed. Once the installation of the new battery has been confirmed, process 70 is terminated at end block 110.

CONCLUSION

An example system and method for checking a vehicle battery's health has been disclosed.

As used herein, the adverb "substantially" means that a shape, structure, measurement, quantity, time, etc. may deviate from an exact described geometry, distance, measurement, quantity, time, etc., because of imperfections in materials, machining, manufacturing, transmission of data, computational speed, etc.

With regard to the references to ECUs in the present description, computing devices such as those discussed herein generally each include instructions executable by one or more computing devices such as those identified above, and for carrying out blocks or steps of processes described above. For example, process blocks discussed above are embodied as computer executable instructions.

In general, the computing systems and/or devices described may employ any of a number of computer operating systems, including, but by no means limited to, versions and/or varieties of the Ford Sync® application, AppLink/Smart Device Link middleware, the Microsoft Automotive® operating system, the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OSX and iOS operating systems distributed by Apple Inc. of Cupertino, Calif., the BlackBerry OS distributed by Blackberry, Ltd. of Waterloo, Canada, and the Android operating system developed by Google, Inc. and the Open Handset Alliance, or the QNX® CAR Platform for Infotainment offered by QNX Software Systems. Examples of computing devices include, without limitation, an on-board vehicle computer, a computer workstation, a server, a desktop, notebook, laptop, or handheld computer, or some other computing system and/or device.

Computers and computing devices generally include computer-executable instructions, where the instructions may be executable by one or more computing devices such as those listed above. Computer executable instructions may be compiled or interpreted from computer programs created using a variety of programming languages and/or technologies, including, without limitation, and either alone or in combination, Java™, C, C++, Matlab, Simulink, Stateflow, Visual Basic, Java Script, Perl, HTML, etc. Some of these applications may be compiled and executed on a virtual machine, such as the Java Virtual Machine, the Dalvik virtual machine, or the like. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a computing device is generally a collection of data stored on a computer readable medium, such as a storage medium, a random access memory, etc.

Memory may include a computer-readable medium (also referred to as a processor-readable medium) that includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of an ECU. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

With regard to the media, processes, systems, methods, heuristics, etc. described herein, it should be understood that, although the steps of such processes, etc. have been described as occurring according to a certain ordered sequence, such processes may be practiced with the described steps performed in an order other than the order described herein. It further should be understood that certain steps may be performed simultaneously, that other steps may be added, or that certain steps described herein may be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their plain and ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A computing device, programmed to:
   electrically load a vehicle battery of a vehicle upon determining that an ambient temperature equals or exceeds a first temperature;
   measure a voltage of the battery during loading;
   determine a magnitude of a voltage plateau; and
   identify the battery as inadequate upon determining that the magnitude of the plateau is less than a target voltage.

2. The computing device of claim 1, further programmed to, upon determining that the magnitude of the plateau is equal to or greater than the target voltage again load the battery, make a second measurement of the battery voltage and identify a second voltage plateau, determine a magnitude of the second plateau, and identify the battery as inadequate upon determining that the magnitude of the second plateau is less than a target voltage.

3. The computing device of claim 2, wherein loading of the battery is achieved by energizing a starter motor and defueling an engine prior to loading the vehicle battery.

4. The computing device of claim 1, wherein loading of the battery is achieved by energizing a starter motor.

5. The computing device of claim 4, further programmed to defuel a vehicle engine prior to loading the vehicle battery.

6. The computing device of claim 1, further programmed to adjust the target voltage for an ambient temperature.

7. The computing device of claim 6, wherein the target voltage is 9.5 volts at an ambient temperature of seventy degrees Fahrenheit.

8. The computing device of claim 1, further programmed to order a replacement battery when the vehicle battery is identified as inadequate.

9. The computing device of claim 8, further programmed to direct the vehicle to a service facility for installation of the replacement battery.

10. The computing device of claim 9, further programmed to summon a mobile battery service when the vehicle is not able to travel to the service facility.

11. A method of determining and responding to a vehicle battery's health, the method comprising the steps of:
    electrically loading a vehicle battery of a vehicle upon determining that an ambient temperature equals or exceeds a first temperature;
    measuring a voltage of the battery during loading;
    determining a magnitude of a voltage plateau; and
    identifying the battery as inadequate upon determining that the magnitude of the plateau is less than a target voltage.

12. The method of claim 11, further comprising the step of, upon determining that the magnitude of the plateau is equal to or greater than the target voltage, again loading the battery, making a second measurement of the battery voltage and identifying a voltage plateau, determining a magnitude of the second plateau, and identifying the battery as inadequate upon determining that the magnitude of the second plateau is less than a target voltage.

13. The method of claim 12, wherein loading of the battery is achieved by energizing a starter motor and to defuel an engine prior to loading the vehicle battery.

14. The method of claim 11, wherein loading of the battery is achieved by energizing a starter motor.

15. The method of claim 14, further comprising the step of further defueling a vehicle engine prior to loading the vehicle battery.

16. The method of claim 11, further comprising the step of adjusting the target voltage for an ambient temperature.

17. The method of claim 16, wherein the target voltage is 9.5 volts at an ambient temperature of seventy degrees Fahrenheit.

18. The method of claim 11, further comprising the step of ordering a replacement battery when the vehicle battery is identified as inadequate.

19. The method of claim 18, further comprising the step of directing the vehicle to a service facility for installation of the replacement battery.

20. The method of claim 19, further comprising the step of summoning a mobile battery service when the vehicle is not able to travel to the service facility.

* * * * *